US010969910B2

(12) United States Patent
Salter et al.

(10) Patent No.: US 10,969,910 B2
(45) Date of Patent: Apr. 6, 2021

(54) VARIABLE SIZE USER INPUT DEVICE FOR VEHICLE

(71) Applicant: Ford Global Technologies, LLC, Dearborn, MI (US)

(72) Inventors: Stuart C. Salter, White Lake, MI (US); Pietro Buttolo, Dearborn Heights, MI (US); Kristopher Brown, Dearborn, MI (US); David Brian Glickman, Southfield, MI (US); Cornel Lewis Gardner, Romulus, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 16/223,504

(22) Filed: Dec. 18, 2018

(65) Prior Publication Data

US 2020/0192501 A1 Jun. 18, 2020

(51) Int. Cl.
| G09G 5/00 | (2006.01) |
| G06F 3/044 | (2006.01) |
| H03K 17/955 | (2006.01) |
| G06F 3/0488 | (2013.01) |
| G06F 3/0482 | (2013.01) |
| B60K 35/00 | (2006.01) |
| G06F 3/0484 | (2013.01) |

(52) U.S. Cl.
CPC .............. *G06F 3/044* (2013.01); *B60K 35/00* (2013.01); *G06F 3/0482* (2013.01); *G06F 3/04845* (2013.01); *G06F 3/04883* (2013.01); *G06F 3/04886* (2013.01); *H03K 17/955* (2013.01); *B60K 2370/1442* (2019.05)

(58) Field of Classification Search
CPC .... G06F 3/044; G06F 3/0482; G06F 3/04845; G06F 3/04883; G06F 3/04886; B60K 35/955; B60K 2370/1442
USPC .......................................... 345/173; 715/863
See application file for complete search history.

(56) References Cited

U.S. PATENT DOCUMENTS

| 7,248,151 | B2 | 7/2007 | McCall | |
| 9,448,724 | B2 | 9/2016 | Arnold | |
| 9,747,740 | B2 | 8/2017 | Buttolo et al. | |
| 2010/0020031 | A1* | 1/2010 | Hwang | G06F 3/04886 345/173 |
| 2010/0085317 | A1* | 4/2010 | Park | G06F 3/04817 345/173 |
| 2012/0068948 | A1* | 3/2012 | Tomoda | G06F 3/04886 345/173 |
| 2012/0154331 | A1* | 6/2012 | Hasui | G06F 3/044 345/174 |

(Continued)

OTHER PUBLICATIONS

Demuro, Doug "Why Ford's Keypad Entry System is Secretly the Best Thing Ever," Jalopnik, https://jalopnik.com/why-ford-s-keypad-entry-system-is-secretly-the-best-thi-1720567933, 6 pages, Jul. 28, 2015.

*Primary Examiner* — Jennifer T Nguyen
(74) *Attorney, Agent, or Firm* — David Coppiellie; Price Heneveld LLP

(57) ABSTRACT

A vehicle keypad device is provided that includes a touchscreen having an array of proximity sensors located on an exterior of a vehicle, a keypad display displaying virtual input icons proximate the proximity sensors, and a controller for dynamically adjusting size of the displayed virtual input icons based on a touch event.

14 Claims, 8 Drawing Sheets

(56) References Cited

U.S. PATENT DOCUMENTS

| | | | |
|---|---|---|---|
| 2012/0179969 A1* | 7/2012 | Lee | G06F 1/1694 |
| | | | 715/719 |
| 2016/0116980 A1* | 4/2016 | George-Svahn | G06F 3/013 |
| | | | 345/168 |
| 2016/0291862 A1 | 10/2016 | Yaron et al. | |
| 2017/0031542 A1* | 2/2017 | Ryu | G06F 3/04817 |
| 2017/0253192 A1 | 9/2017 | Faist et al. | |
| 2018/0095646 A1* | 4/2018 | Matsubara | G06F 3/04845 |
| 2019/0152433 A1* | 5/2019 | Cumbo | B60R 25/01 |

\* cited by examiner

VARIABLE SIZE USER INPUT DEVICE FOR VEHICLE

FIELD OF THE INVENTION

The present invention generally relates to vehicle input devices, and more particularly relates to an input device, such as a keypad display for use on a vehicle.

BACKGROUND OF THE INVENTION

Automotive vehicles are commonly equipped with various user input devices for entering user inputs to control devices or functions. For example, keypads are often provided on the vehicle body exterior to enable a user to enter a sequence of inputs as a code to actuate a door lock or unlock function without the need to use a mechanical key or key fob. Conventional keypads employed on motor vehicles typically include mechanical switches actutable by a user. Additionally, display devices are often implemented on the interior of the vehicle. It would be desirable to provide for an enhanced input device that may more readily accommodate varying use conditions.

SUMMARY OF THE INVENTION

According to one aspect of the present invention, a vehicle input device is provided. The vehicle input device includes a touchscreen having an array of proximity sensors located on a vehicle, a display displaying virtual input icons, and a controller dynamically adjusting size of the displayed virtual input icons based on a touch event.

Embodiments of the first aspect of the invention can include any one or a combination of the following features:
  the virtual input icons define keypad inputs for a keypad device;
  the device is located on an exterior of the vehicle to control vehicle access based on user input of the keypad device; the device is located on a vehicle pillar;
  each virtual input icon is displayed on an area of the display over a plurality of proximity sensors for sensing user interaction with the icon;
  signals sensed with the plurality of proximity sensors are summed to provide a total signal value that is used to activate a keypad;
  the controller dynamically adjusts a separation distance between virtual input icons;
  the proximity sensors comprise capacitive sensors;
  the capacitive sensors are configured in an array;
  a lighting device for providing backlighting to the virtual input icons
  the size of the displayed virtual input icons is adjusted based on sensed interaction of a user; and
  the size of the displayed virtual input icons is increased when the sensors detect activity and which icon is associated with the activity cannot be determined.

According to another aspect of the present invention, a vehicle keypad device is provided. The vehicle keypad device includes a touchscreen having an array of proximity sensors located on an exterior of a vehicle, a keypad display displaying virtual input button icons proximate the proximity sensors, and a controller dynamically adjusting size of the displayed virtual input button icons based on a touch event.

Embodiments of the second aspect of the invention can include any one or a combination of the following features:
  the device is configured to control vehicle access based on user input of the keypad device;
  each virtual input button icon is displayed on an area of the display over a plurality of proximity sensors for sensing user interaction with the icon;
  signals sensed with the plurality of proximity sensors are summed to provide a total signal value that is used to activate a keypad;
  the controller dynamically adjusts a separation distance between virtual input icons; and
  the proximity sensors comprise capacitive sensors.

According to yet another aspect of the present disclosure, a vehicle keypad user input device is provided. The vehicle keypad user input device includes a touchscreen having an array of capacitive sensors located on a vehicle, a display displaying virtual buttons for controlling access to the vehicle, and a controller dynamically adjusting size of the displayed virtual buttons based on a user touch event.

Embodiments of the third aspect of the invention can include any one or a combination of the following feature:
  the controller dynamically adjusts a separation distance between virtual input icons.

These and other aspects, objects, and features of the present invention will be understood and appreciated by those skilled in the art upon studying the following specification, claims, and appended drawings.

DETAILED DESCRIPTION OF THE PREFERRED EMBODIMENTS

Additional features and advantages of the invention will be set forth in the detailed description which follows and will be apparent to those skilled in the art from the description, or recognized by practicing the invention as described in the following description, together with the claims and appended drawings.

Figure 1:
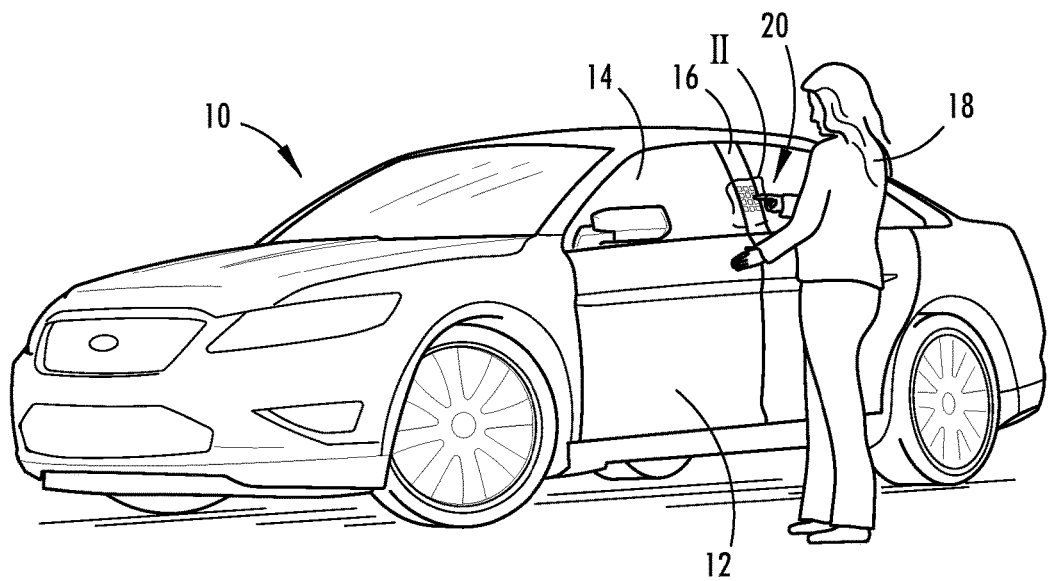
FIG. 1 is a side perspective view of a motor vehicle equipped with a vehicle keypad user input device for inputting keypad inputs on the vehicle, according to one embodiment.

For purposes of description herein, the terms "upper," "lower," "right," "left," "rear," "front," "vertical," "horizontal," and derivatives thereof shall relate to the invention as oriented in FIG. 1. However, it is to be understood that the invention may assume various alternative orientations, except where expressly specified to the contrary. It is also to be understood that the specific devices and processes illustrated in the attached drawings, and described in the following specification are simply exemplary embodiments of the inventive concepts defined in the appended claims. Hence, specific dimensions and other physical characteristics relating to the embodiments disclosed herein are not to be considered as limiting, unless the claims expressly state otherwise.

Referring to FIG. 1, a wheeled motor vehicle 10 is generally illustrated having a vehicle keypad user input device 20 shown configured as a vehicle door access keypad assembly that enables a person to enter a sequence of inputs such as to lock and unlock the vehicle doors and open and close the one or more doors, according to one embodiment. The vehicle keypad user input device 20 may also be configured as an input and output device to provide a display and user inputs for other applications, according to other embodiments. The vehicle 10 may be a wheeled vehicle that generally includes passenger doors 12 provided on the vehicle body and a door latch lock assembly is typically built into each door to lock and unlock the door and other doors on the vehicle to control access to the vehicle 10. The door latch lock assembly may be an electronic controlled assembly. It should be appreciated that a driver or other user 18, e.g., passenger, may interface with the vehicle keypad user input device 20 to view inputs such as keypads and sequentially input a code as a sequence of inputs from the outside or exterior of the vehicle 10. The vehicle keypad user input device 20 is shown located on a vehicle body support pillar, such as the B-pillar 16 generally located between a forward passenger door and rearward passenger door and facing the exterior on the side of the vehicle 10. It should be appreciated that the vehicle keypad user input device 20 may be located elsewhere on the vehicle 10 such as within the window 14 of a passenger door 12, the windshield, a door trim piece, a mirror assembly or other vehicle body member.

The vehicle keypad user input device 20 advantageously employs a touchscreen located on the exterior of the vehicle 10 and configured for a user located outside the vehicle 10 to interact with the touchscreen to enter user inputs. In addition, the vehicle input device 20 includes a display for displaying virtual input icons that may be overlaid over proximity (e.g., capacitive) sensors in a settable size and at a settable separation distance from one another. Further, the vehicle keypad user input device 20 includes a controller for dynamically adjusting the size of the displayed virtual input icons based on a user touch event. For example, when a user 18 approaches the vehicle 10 and initially interacts with the vehicle keypad input device 20, the amount of sensed interaction of the user's finger may be sensed and the size of the keypads and separation distance between adjacent keypads may be set based on the initial interaction with the user's finger. If the amount of sensed signal due to user interaction is small, the size may be increased, and if a large signal is sensed the size may be decreased, according to one embodiment. In a specific embodiment, the size of the keypads may be increased when sensor activity is detected but no determination on which keypad was contacted can be made.

Figure 2:
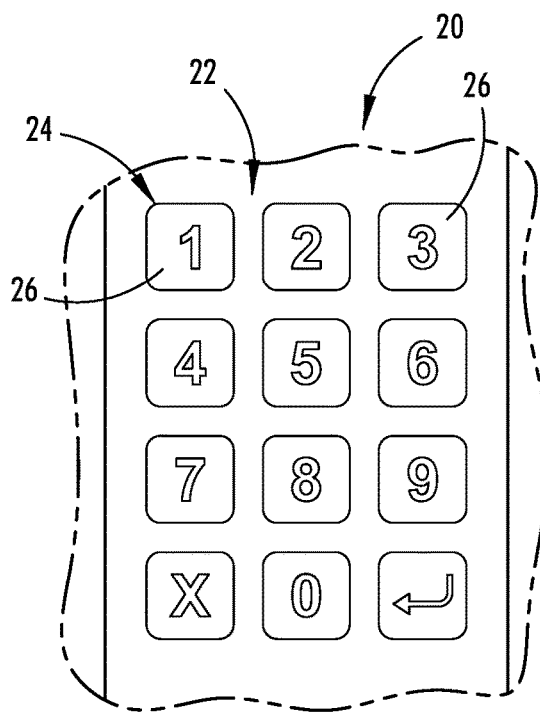
FIG. 2 is an enlarged view of section II of FIG. 1 illustrating the vehicle keypad user input device displaying a first size keypad.
Figure 3:
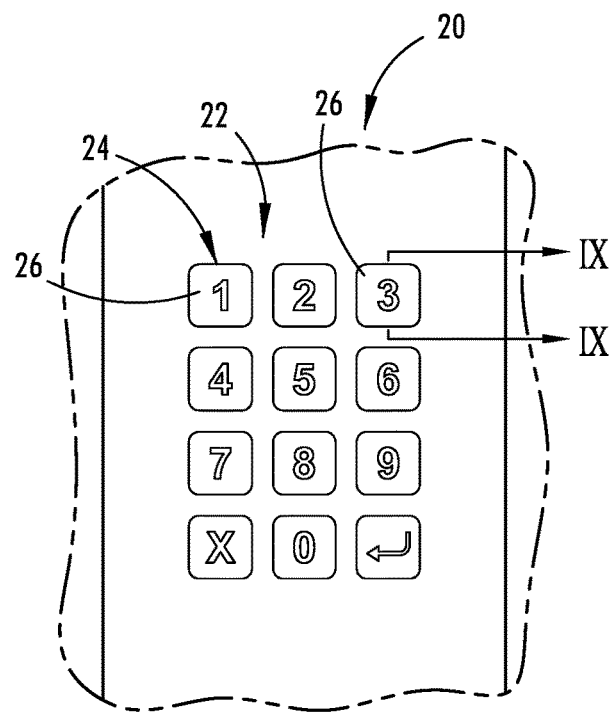
FIG. 3 is an enlarged view of section II of FIG. 1 illustrating the vehicle keypad user input device displaying a reduced second size keypad.

Referring to FIGS. 2 and 3, the size of the vehicle keypad user input device 20 may be varied between an increased first size with a greater separation distance shown in FIG. 2 and a decreased second size with lesser separation in distance shown in FIG. 3. The touchscreen 22 has proximity sensors and the display 24 overlays the proximity sensors to display virtual button icons 26 in the form of selectable input pads having identification characters. The characters are shown including numerical characters 0-9 and other characters for entering a code such as a sequence of character inputs that may be entered by a user to enter a code that is programmed into the controller. The vehicle keypad user input device 20 may present virtual button icons 26 having the large first size and a greater first separation distance between adjacent icons 26 as seen in FIG. 2. This enables the user to more efficiently and effectively interact with the keypad with enhanced signal interaction due to the larger number of sensors associated with each virtual button icon 26. When a lesser capacitive signal is sufficient for use with the finger and/or a more discreet output display is desired, the keypad may be displayed and operate in a reduced second size mode shown in FIG. 3 in which each of the virtual buttons icons 26 has a smaller second size and are located closer together with a lesser second separation distance between adjacent icons 26. This allows for a more compact display of the virtual button icons 26 which may be beneficial when a user is entering a security code that is meant to be hidden from view from other persons.

Figure 4:
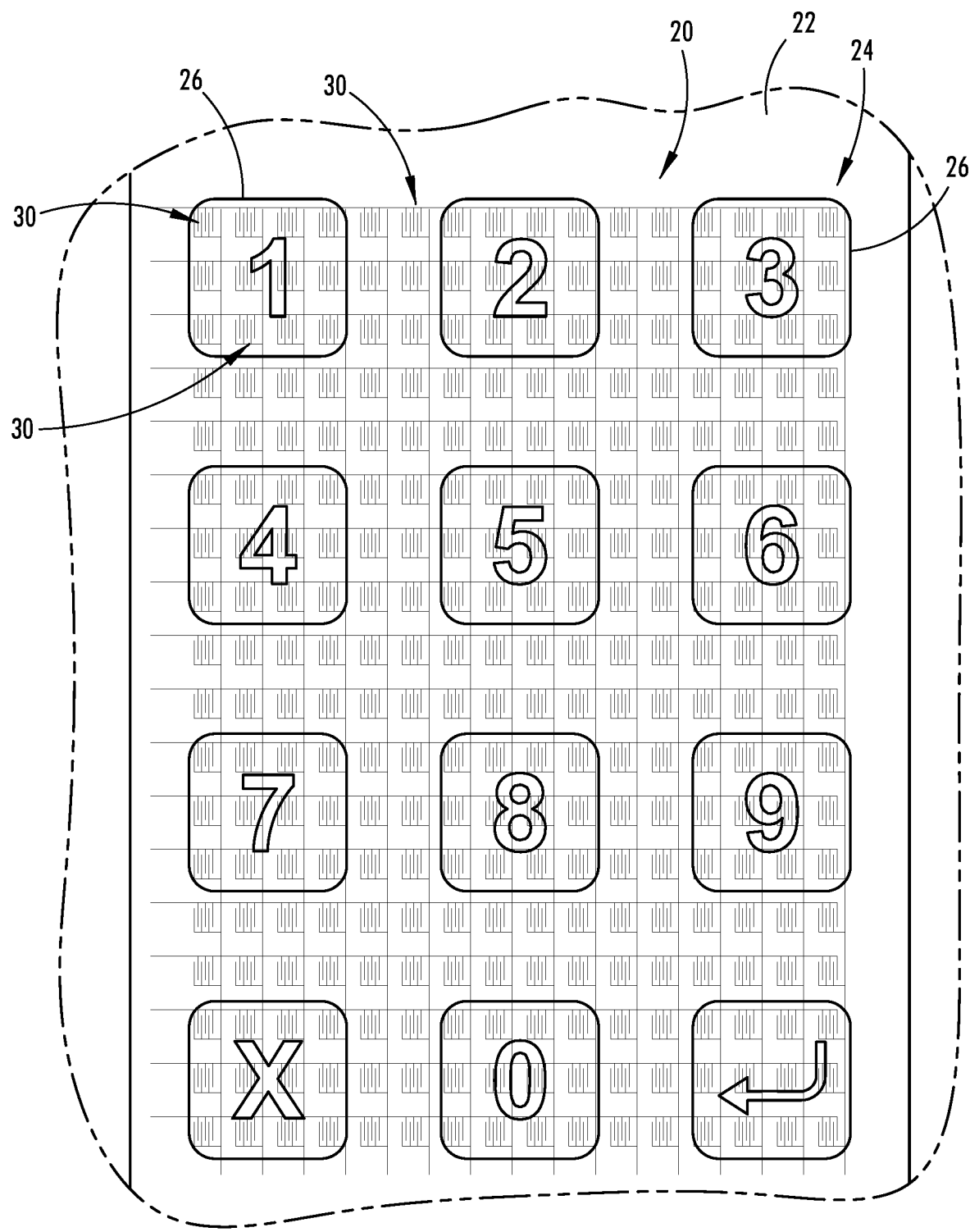
FIG. 4 is a schematic diagram illustrating a capacitive sensor array for use in the vehicle keypad user input device overlayed with the first size enlarged keypads, according to a first embodiment.
Figure 5:
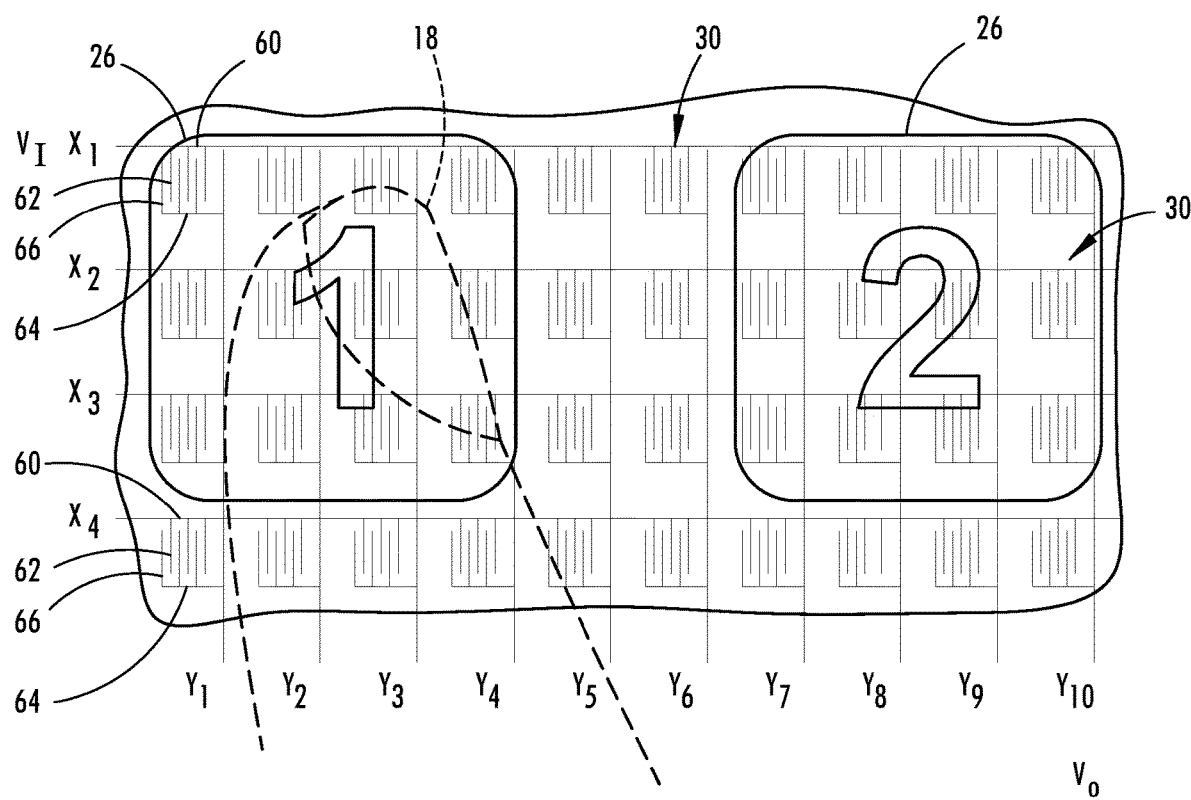
FIG. 5 is an enlarged view of a portion of FIG. 4 further illustrating the enlarged keypads and sensor array and a finger interacting therewith.

Referring to FIGS. 4 and 5, the touchscreen 22 is illustrated having an array of proximity sensors 30 arranged in rows and columns, according to one embodiment. The proximity sensors 30 are shown configured as capacitive sensors having pairs of electrodes, according to a first embodiment. Each of the capacitive sensors 30 includes a first electrode 60 and a second electrode 64. Each of the first and second electrodes 60 and 64 includes respective pluralities of conductive electrode fingers 62 and 66, respectively. As such, the first electrode 60 has a first plurality of electrode fingers 62 and the second electrode 64 has a second plurality of electrode fingers 66. Each of the first and second electrode fingers 62 and 66 are generally positioned to be interdigitated or interlaced with the other of the first and second plurality of electrode fingers 62 and 66 to at least some degree to generate a capacitive activation field for sensing the presence of an object such as a user's hand or finger. Each of the first electrodes 60 may be configured as a receive electrode that receives a sense signal, and each of the second electrodes 64 may be configured as drive electrodes to receive a drive signal. The electrodes 60 and 64 are arranged in an array of rows and columns. The first electrodes 60 are fed signals shown on lines X1-Xn and the second electrodes receive signals Y1-Y10 as seen in FIG. 5. Each capacitive sensor 30 receives an X signal, X1-X4 and generates a corresponding Y signal, Y1-Y10 that generates an activation field and provides an indication as to the capacitance sensed with that capacitive sensor 30.

The capacitive sensors 30 each provide a capacitive sense activation field to sense contact or close proximity (e.g., within one millimeter) of a user, such as a finger, in relation to the corresponding capacitive sensor 30. The capacitive sense activation field of each capacitive sensor 30 detects a user's finger which has electrical conductivity and dielectric properties that cause a change or disturbance in the capacitive sense activation field as should be evident to those skilled in the art. Each of the capacitive sensors 30 provides a sensed signal for the corresponding area proximate to the capacitive sensor 30 which is indicative of a user input for that area. A plurality of capacitive sensors 30 are used together to provide a signal for a virtual button 26 or keypad, and the number of capacitive sensors dedicated to each virtual button 26 varies depending on the size of the virtual button 26.

In the embodiment shown, the capacitive sensors each generally have a drive electrode 60 and a receive electrode 64, each having interdigitated fingers for generating a capacitive field. It should be appreciated that the array of capacitive sensors may be formed by printed conductive ink or by assembling flex conductive circuitry onto a substrate. According to one embodiment, the drive electrode 60 receives square wave drive signal pulses applied at a voltage $V_I$. The receive electrode 64 has an output for generating an output voltage $V_O$. It should be appreciated that the electrodes and electrode fingers may be arranged in various configurations for generating the capacitive fields as the sense activation fields, according to various embodiments. It should further be appreciated that the capacitive sensors may be otherwise configured to each and have dedicated signal lenses coupled to the drive and receive electrodes.

As seen in FIGS. 4 and 5, each virtual button icon 26 has a first size that, in this example, overlays twelve (12) proximity sensors 30. That is, the twelve underlaying proximity sensors 30 are used to sense the signal interacting with the corresponding virtual button icon 26. The virtual button icons 26 arranged in rows and columns are shown separated from the adjacent virtual button icons 26 via two proximity sensors which define a gap therebetween and thus a first separation distance. When a finger of a user 18 interacts with the first size icon 26 as seen in FIG. 5, each of the sensors 30 proximate to the user's finger and overlayed by the virtual button icon 26 generates a signal that may be used to enter an input for the corresponding virtual button icon 26.

Figure 6:
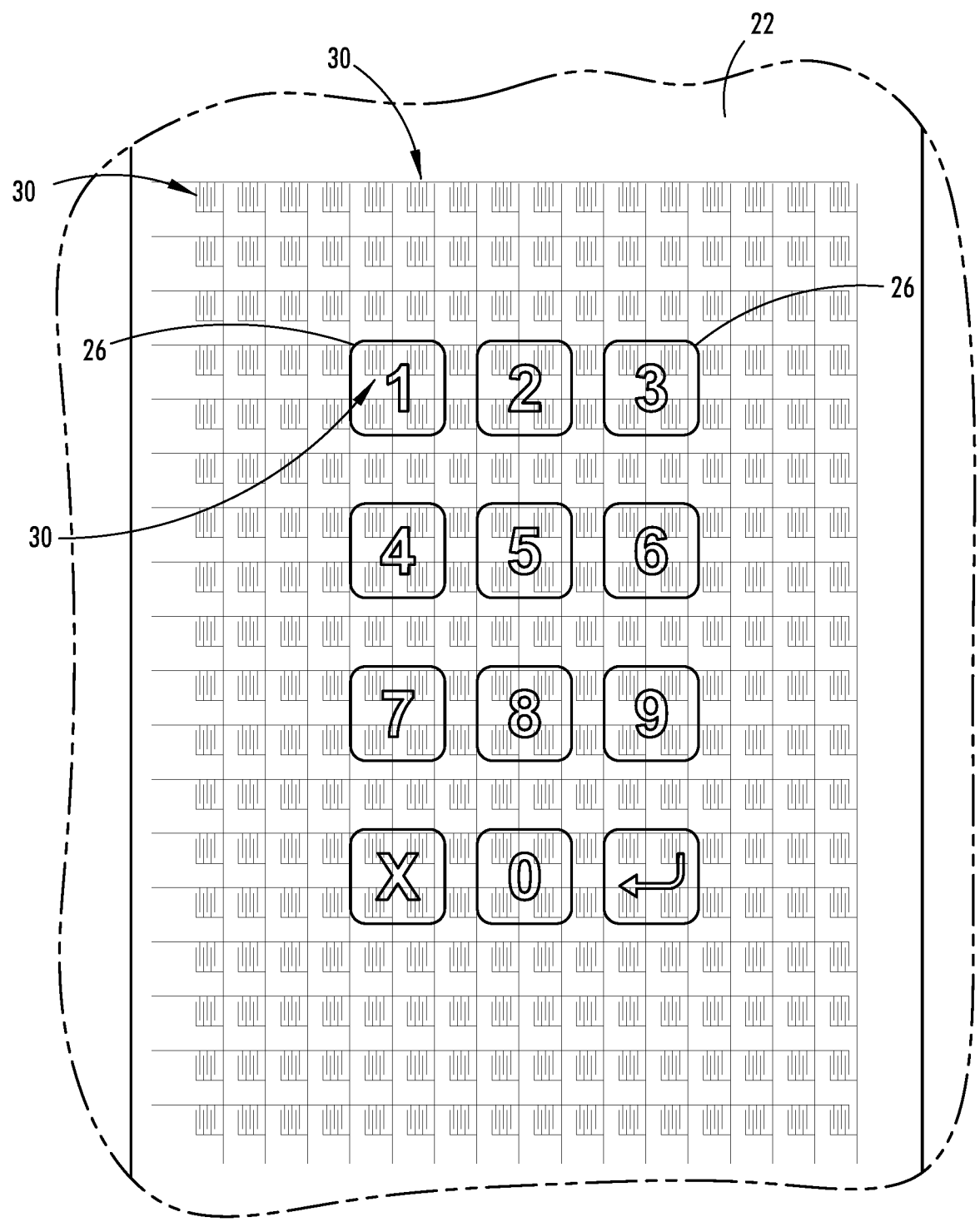
FIG. 6 is a schematic diagram of the vehicle keypad user input device further showing the capacitive sensors and the keypads in the reduced second size.
Figure 7:
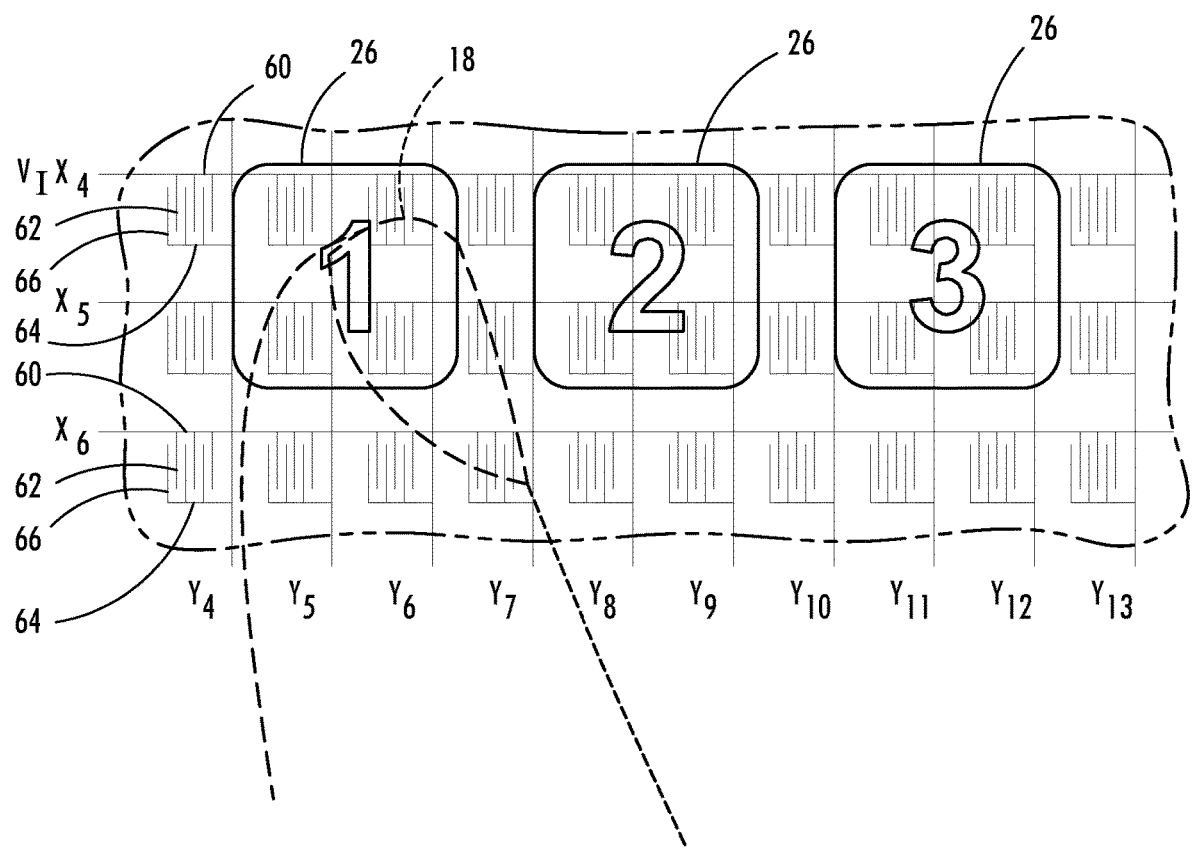
FIG. 7 is a schematic diagram illustrating an enlarged portion of the vehicle keypad user input device of FIG. 6 further illustrating a finger interacting with the sensors.

Referring to FIGS. 6 and 7, the vehicle keypad user input device 20 is shown having virtual button icons 26 of a second size which is less than the first size shown in FIGS. 4 and 5. In this example, the second size of the virtual button icons 26 overlays four (4) proximity sensors 30 and each of the virtual button icons 26 are separated in rows and columns from adjacent icons 26 by a second separation gap or distance of one sensor 30 which is less than the first distance. As such, only four sensors are dedicated to each virtual button icon 26 and are used to identify an input with the corresponding virtual button icon 26. When a user interacts with one of the reduced second size icon 26 as shown in FIG. 7, the four capacitive sensors associated with that icon 26 are used to generate a signal indicative of the interaction therewith. While the virtual button icons 26 are shown centered about the display, it should be appreciated that the virtual button icons 26 may be otherwise located on the display such as in a corner or nearer to one side of the display. It should further be appreciated that other variations in size between the first size and second size may be used and the first and second separation distances may be greater or less for a given application.

Figure 8:
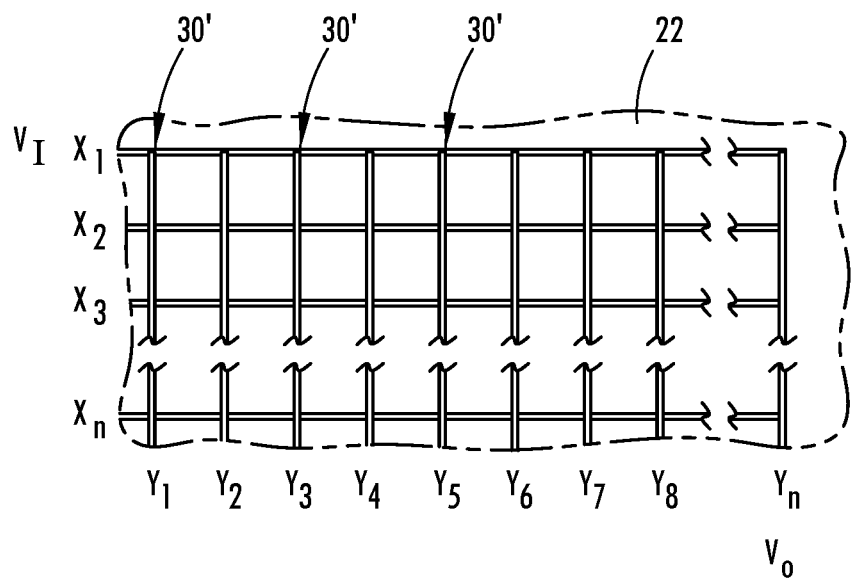
FIG. 8 is a schematic diagram of a capacitive sensor array for use in the vehicle keypad user input device, according to a second embodiment.

Referring to FIG. 8, an array of proximity sensors 30' in the form of single electrode capacitive sensors 30A'-30n' is illustrated in a second embodiment as an alternative to the two electrode capacitive sensor arrangement discussed above. In this embodiment, the touchscreen 22 may include an array of single electrode configured capacitive sensors 30' receiving signals in rows X1-Xn and columns Y1-Yn array. The array of sensors thereby defines rows and columns of single-ended capacitive sensors 30' which may be used to sense user interaction with virtual button icons of varying sizes with the number of sensors 30' and separation distance that varies depending upon the size of the virtual button icons as discussed above in the two electrode sensor configuration.

Figure 9:
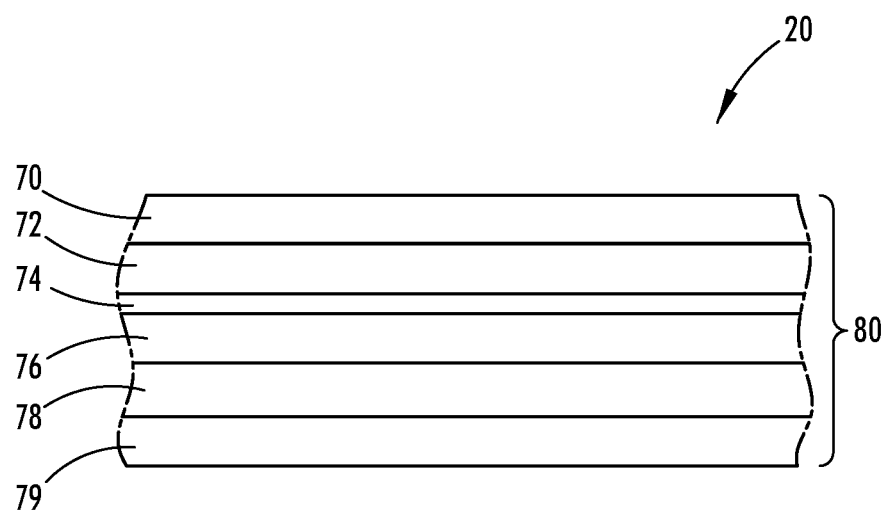
FIG. 9 is a cross-sectional view taken through line IX-IX of FIG. 3 illustrating layers of the vehicle keypad user input device.

Referring to FIG. 9, the vehicle keypad user input device 20 is further illustrated taken from a cross section in FIG. 3 according to one embodiment. The cross section illustrates how a display 80 may be formed by a plurality of layers. The display 80 may be formed by a plurality of stacked layers. In an exemplary embodiment, the layers may comprise a backing shell 70, which may be formed of a heat conductive material. For example, in some embodiments, the backing shell 70 may be formed of a thermally conductive plastic or polymeric material, which may be conductively connected to a vehicle structure such as a support pillar. In this configuration, excess heat that may be generated by a backlight layer 72 may be conducted outward through the backing shell 70 and into a material forming the support structure (e.g., a metallic material forming the frame of the vehicle 10). In this way, the display 80 may be configured to conduct heat outward into one or more panels of the vehicle 10 to dissipate any unnecessary and/or potentially damaging heat.

The backlight layer 72 may be adjacent to and/or in contact with the backing shell 70. The backlight layer 72 may comprise a plurality of LEDs or other highly efficient light sources distributed over the display surface of each of the display. The light sources of the backlight layer 72 may be configured to directly emit a generated light outward from the backlight layer 72 in a direct lighting configuration. In this way, the display 80 may maximize a brightness of the visual information displayed on the display such that the display 80 may function in a wide range of ambient lighting conditions (e.g., dark ambient lighting conditions to direct sunlight conditions).

In operation, the controller of the display 80 may control the backlight layer 72 to direct the generated emission of the light outward into a liquid crystal display (LCD) layer 74. The display 74 may selectively transmit the light generated by the backlight layer 72 through the liquid crystal display layer 74 outward into one or more of a heater layer 76, a touch sensor layer 78, and/or a protective layer 79. In this configuration, the display 80 may provide a robust display touchscreen, which may be controlled to not only display the visual information such as keypad icons, but also, provide for the user interface via capacitive sensors in the touch sensor layer 78 and various additional beneficial features as discussed herein.

The heater layer 76 may be implemented as a thin film comprising a plurality of heater strips which may be formed by indium tin oxide (ITO), a conductive film or ink (PDOT), and or various other suitable materials. The touch sensor layer 78 may be implemented by the capacitive sensors or various other forms of proximity sensors and may form a matrix of detection regions distributed over the display surface of the display 80. Finally, the protective layer 79 may correspond to a scratch and/or impact resistant glass or similar transparent material (e.g. Gorilla® glass, Willow® glass, etc.) and may comprise one or more coatings configured to prevent dust and/or contaminant buildup (e.g., a titanium dioxide coating). Accordingly, as discussed herein, the display may provide for a highly effective visual display 80 that may be operable to provide various user interface functions and communicate visual information from the exterior of the vehicle 10.

Figure 10:
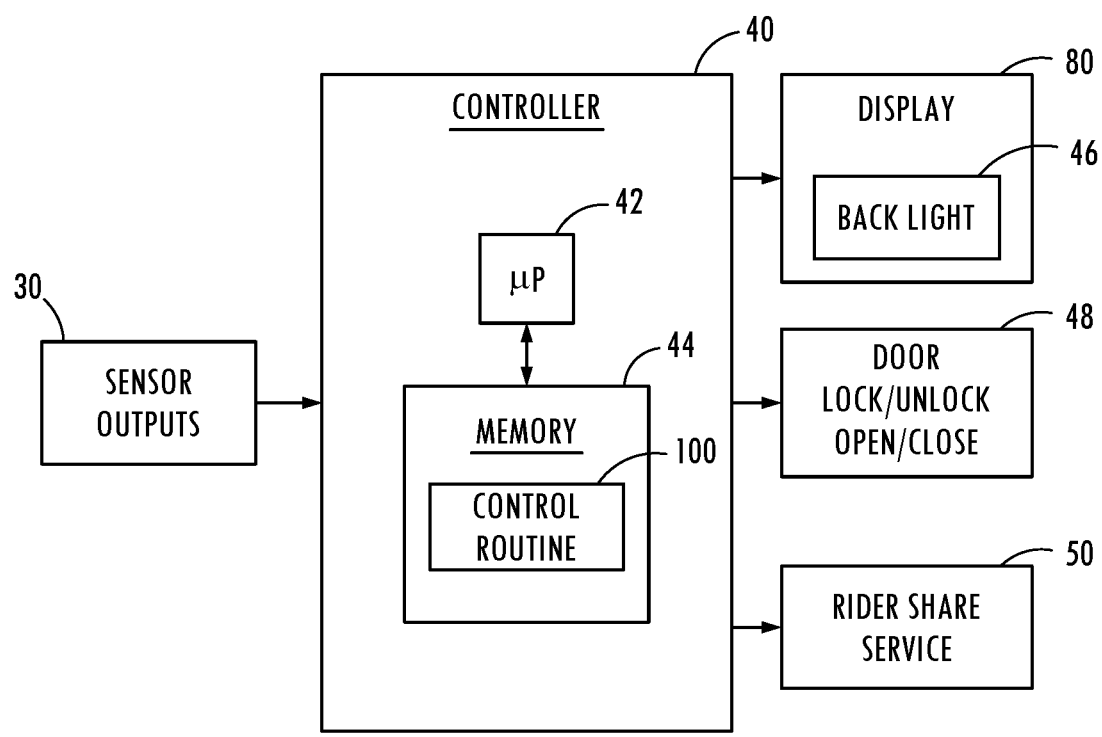
FIG. 10 is a block diagram further illustrating the vehicle keypad user input device, according to one embodiment.

Referring to FIG. 10, the vehicle keypad user input device 20 is further illustrated having a controller 40 which may include a microprocessor 42 and memory 44. It should be appreciated that the controller 40 may include other analog and/or digital control circuitry. The controller 40 receives the sensor outputs from the proximity sensors and generates output signals to control various functions. For example, the output signals may control a back light 46 for the display 80 and may control the liquid crystal display 52 and other aspects of the display 80. Additionally, the controller 40 may control the door lock/unlock/open/close mechanism 48 on the vehicle. Further, controller 40 may provide information to one or more ride share services 50. For example, a ride share service 50 may allow for the display 80 to display other information for ride share users and to allow for other inputs to be entered on the touchscreen. The controller 40 may execute a control routine 100 stored in memory 44 via the microprocessor 42 to control the various functions.

Figure 11:
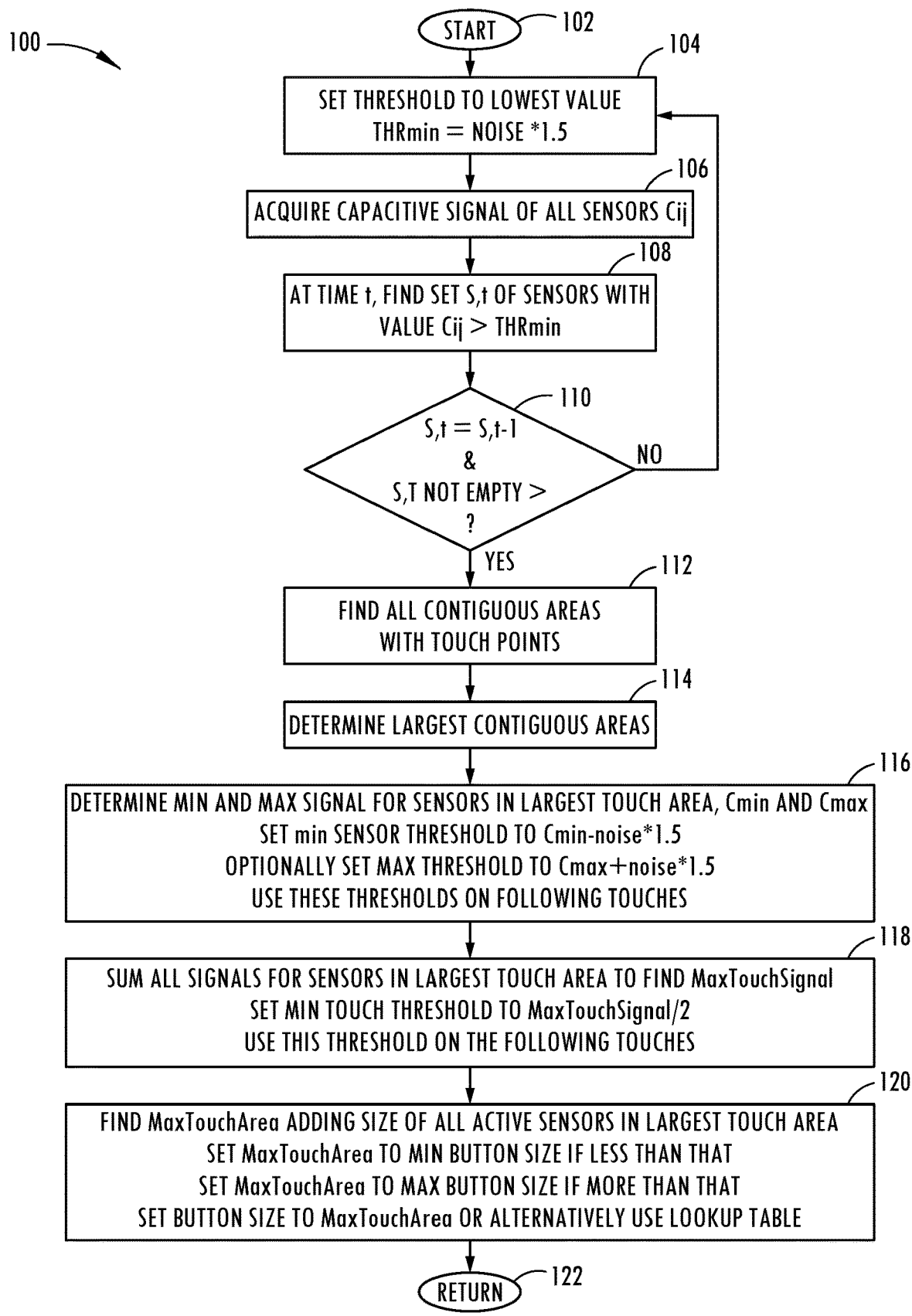
FIG. 11 is a flow diagram illustrating a routine for controlling the variable size of the vehicle keypad user input device, according to one embodiment.

Referring to FIG. 11, the control routine 100 for controlling the variable size and separation distance of the virtual icons is illustrated, according to one embodiment. Routine 100 begins at step 102 and proceeds to step 104 to set the threshold to the lowest value which is shown as $THR_{min}$ equal to a noise parameter (NOISE) multiplied by a factor of 1.5. Next, routine 100 proceeds to step 106 to acquire the capacitive signal of all capacitive sensors. At step 108, routine 100 at a given time t finds a set S, t of capacitive sensors with a value $C_{ij}$ greater than the minimum threshold $THR_{min}$. Thereafter, routine 100 proceeds to decision step 110 to determine if the set S, t of sensor values for the current value is equal to the prior value and is not empty and, if not, returns to step 104. Otherwise, routine 100 proceeds to step 112 to find all contiguous areas of the touchscreen display with touchpoints and then to step 114 to determine the largest contiguous area. Next, at step 116, routine 100 determines the min and max signal for sensors in the largest touch area, identified as $C_{min}$ and $C_{max}$; sets the min sensor threshold to a value $C_{min}$ minus noise multiplied by 1.5; optionally sets a max threshold to $C_{max}$ plus noise multiplied by 1.5; and uses these thresholds on subsequent user input touches. At step 118, routine 100 sums all signals for capacitive sensors in the largest touch area to find a max touch signal; sets a min touch threshold to max touch signal divided by 2; and uses this threshold for subsequent user input touches. Finally, at step 120, routine 100 finds a max touch area adding size of all active sensors in the largest touch area; sets the max touch area to min button size if less than that; sets the max touch area to max button size if more than that; and sets the button size to max touch area or alternatively uses a lookup table 120 before returning at step 122.

Accordingly, the vehicle input device 20 advantageously employs a touchscreen display 80 and virtual button icons 26 to provide a keypad on a vehicle. The vehicle input device 20 advantageously adjusts the size of the virtual button icons 26 which may allow for enhanced or reduced sensitivity due to the greater or lesser number of proximity sensors 30 employed for each virtual button icon 26. Additionally, the separation distance between the virtual button icons 26 may be increased or decreased. As such, a variable size of the display device may be achieved.

It is to be understood that variations and modifications can be made on the aforementioned structure without departing from the concepts of the present invention, and further it is to be understood that such concepts are intended to be covered by the following claims unless these claims by their language expressly state otherwise.

What is claimed is:

1. A vehicle input device comprising:
   a touchscreen having an array of proximity sensors located on a vehicle;
   a display displaying virtual input icons, wherein the virtual input icons define keypad inputs for a keypad device; and
   a controller dynamically adjusting size of the displayed virtual input icons based on a touch event, wherein the size of the displayed virtual input icons is adjusted based on sensed interaction of a user and an amount of sensed signal of an area touched during a user interaction with one of the keypad inputs, wherein the size of the displayed virtual input icons is increased when the amount of sensed signal is small and is decreased when the amount of sensed signal is large, wherein each virtual input icon is displayed on an area of the display over a plurality of proximity sensors for sensing user interaction with the icon, and wherein signals sensed with the plurality of proximity sensors are summed to provide a total signal value that is used to activate a keypad.

2. The input device of claim 1, wherein the device is located on an exterior of the vehicle to control vehicle access based on user input of the keypad device.

3. The input device of claim 1, wherein the device is located on a vehicle pillar.

4. The input device of claim 1, wherein the controller dynamically adjusts a separation distance between virtual input icons.

5. The input device of claim 1, wherein the proximity sensors comprise capacitive sensors.

6. The input device of claim 5, wherein the capacitive sensors are configured in an array.

7. The input device of claim 1 further comprising a lighting device for providing backlighting to the virtual input icons.

8. The input device of claim 1, wherein the size of the displayed virtual input icons is increased when the sensors detect activity and which icon is associated with the activity cannot be determined.

9. A vehicle keypad device comprising:
   a touchscreen having an array of proximity sensors located on an exterior of a vehicle;
   a keypad display displaying virtual input button icons proximate the proximity sensors, wherein the virtual input icons define keypad inputs for the keypad display; and
   a controller dynamically adjusting size of the displayed virtual input button icons based on a touch event, wherein the size of the displayed virtual input icons is adjusted based on sensed interaction of a user and an amount of sensed signal of an area touched during a user interaction with one of the keypad inputs, wherein the size of the displayed virtual input icons is increased when the amount of sensed signal is small and is decreased when the amount of sensed signal is large, wherein each virtual input button icon is displayed on an area of the display over a plurality of proximity sensors for sensing user interaction with the icon, and wherein signals sensed with the plurality of proximity sensors are summed to provide a total signal value that is used to activate a keypad.

10. The keypad device of claim 9, wherein the device is configured to control vehicle access based on user input of the keypad device.

11. The keypad device of claim 9, wherein the controller dynamically adjusts a separation distance between virtual input icons.

12. The keypad device of claim 9, wherein the proximity sensors comprise capacitive sensors.

13. A vehicle keypad user input device comprising:
- a touchscreen having an array of capacitive sensors located on a vehicle;
- a display displaying virtual buttons for controlling access to the vehicle, wherein the virtual input icons define keypad inputs for a keypad device; and
- a controller dynamically adjusting size of the displayed virtual buttons based on a user touch event, wherein the size of the displayed virtual input icons is adjusted based on sensed interaction of a user and an amount of sensed signal of an area touched during a user interaction with one of the keypad inputs, wherein the size of the displayed virtual input icons is increased when the amount of sensed signal is small and is decreased when the amount of sensed signal is large, wherein each virtual input button icon is displayed on an area of the display over a plurality of capacitive sensors for sensing user interaction with the icon, and wherein signals sensed with the plurality of capacitive sensors are summed to provide total signal value that is used to activate a keypad.

14. The keypad device of claim 13, wherein the controller dynamically adjusts a separation distance between virtual input icons.

\* \* \* \* \*